United States Patent [19]
Sheffer et al.

[11] Patent Number: 4,951,004
[45] Date of Patent: Aug. 21, 1990

[54] COHERENT DIRECT DIGITAL SYNTHESIZER

[75] Inventors: Tzafrir Sheffer; Eric Drucker, both of Seattle, Wash.

[73] Assignee: John Fluke Mfg. Co., Inc., Everett, Wash.

[21] Appl. No.: 325,359

[22] Filed: Mar. 17, 1989

[51] Int. Cl.[5] .......................... H03B 19/00; H03L 7/18
[52] U.S. Cl. .................................... 331/1 A; 307/271; 328/14; 331/25
[58] Field of Search .................. 331/1 A, 2 J; 328/14; 307/271

[56] References Cited

U.S. PATENT DOCUMENTS

| | | | |
|---|---|---|---|
| 3,735,269 | 5/1973 | Jackson | 328/14 |
| 3,824,483 | 7/1974 | Margala et al. | 331/1 A |
| 3,882,403 | 6/1975 | Gerken | 328/14 |
| 3,949,304 | 4/1976 | McClaskey | 331/1 A X |
| 3,949,305 | 4/1976 | McClaskey et al. | 331/1 A X |
| 4,134,072 | 1/1979 | Bolger | 328/14 |
| 4,144,579 | 3/1979 | Nossen et al. | 364/607 |
| 4,240,034 | 12/1980 | Lowenschuss | 328/14 |
| 4,380,743 | 4/1983 | Underhill et al. | 331/1 A |
| 4,563,657 | 1/1986 | Qureshi et al. | 331/25 |
| 4,745,371 | 5/1988 | Haine | 331/1 A |
| 4,752,902 | 6/1988 | Goldberg | 364/721 |

OTHER PUBLICATIONS

Sagun et al. "A 125-MHz 12-Bit Digital-to-Analog Converter System", pp. 78–85, Hewlett-Packard Journal, Apr. 1988.
Eisenson, "DigitalTechniques Hatch High-Speed Direct Synthesizer", pp. 165–170, Microwaver & RF, Oct. 1987.
Kovalick et al., "Arbitrary Waveform Synthesizer Applications in Magnetic Recording and Radar", pp. 86–93, Hewlett-Packard Journal Apr. 1988.
Fred H. Ives, "Multifunction Synthesizer for Building Complex Waveforms", Feb. 1989, Hewlett-Packard Journal, pp. 52–57.
Mark D. Talbot, "Digital Waveform Synthesis IC Architecture", Feb. 1989, Hewlett-Packard Journal, pp. 57–62.
Heikes et al., "Development of a Digital Waveform Synthesis Integrated Circuit", Feb. 1989, Hewlett-Packard Journal, pp. 62–65.
Thomas M. Higgins, Jr., "Analog Output System Design for a Multifunction Synthesizer" Feb. 1989, Hewlett-Packard Journal, Jr., pp. 66–69.
Mark D. Talbot, "Firmware Design for a Multiple-Mode Instrument" Feb. 1989, Hewlett-Packard Journal, pp. 70–73.
Kenneth S. Thompson, "Multifunction Synthesizer Applications", Feb. 1989, Hewlett-Packard Journal, pp. 73–76.
Schwartz et al., "Testing and Process Monitoring for a Multifunction Synthesizer", Feb. 1989, Hewlett-Packard Journal, pp. 77–79.

Primary Examiner—Siegfried H. Grimm
Attorney, Agent, or Firm—Marshall M. Curtis; Israel Gopstein

[57] ABSTRACT

A coherent direct digital waveform synthesizer, capable of generating a waveform in response to a decimally or other non-binary related reference frequency while obtaining the advantages of the use of a binary radix phase accumulator generating binary addresses for a waveform memory. The interface between these elements include a frequency converter including a voltage controlled oscillator and a further binary radix phase accumulator in the feedback path of a phase locked loop. A binary radix related digital waveform synthesizer may be thus made to produce non-binary related frequency waveforms coherent with a non-binary radix reference frequency source, and of decimal or other non-binary radix related resolution.

10 Claims, 2 Drawing Sheets

COHERENT DIRECT DIGITAL SYNTHESIZER

TECHNICAL FIELD

This invention relates to numerically controlled oscillators and especially to direct digital waveform synthesizers capable of developing an arbitrary waveform at an arbitrary frequency In particular, this invention relates to direct digital synthesizers (DDS) and methodology which permit decimal specification of waveform frequency.

BACKGROUND ART

Digital waveform synthesizers are well known and are of widespread use in test equipment and as reference waveform sources In modern communication and other electronic equipment, it has been necessary to develop such synthesizers which are capable of producing waveforms over a wide range of frequencies, typically 0.1 Hz to several MHz, and of high frequency resolution, typically 0.1 Hz. Since it is common in the art to specify a desired frequency as a decimal number, it has become almost a standard in the industry to use a decimally related reference frequency source, typically 10 Hz m(for which high accuracy oscillators are readily available), for direct digital synthesizers. Also because of this convention, it is common to use a binary coded decimal (BCD) adder to accumulate the phase of the synthesized signal to produce the desired frequency from the reference frequency The arrangement disclosed in U.S. Pat. No. 3,735,269 by Jackson is typical of such arrangements.

As used herein, the term "radix" will be used to denote the base of the basic unit of the numerical expression of a number For example, a number in a binary radix is expressed and operated upon solely as a series of digits each expressed as a power of 2 whereas a non-binary radix, such a binary-coded-decimal number, in particular, has a non-binary based digit unit (e.g. 10), values of which being expressed, as is common in the art, with four binary digits, some possible combinations of which are not used.

A block diagram of a common DDS 10 is shown in FIG. 1. This block diagram is typical of either a decimal or binary DDS: The DDS has, as its first stage, a phase accumulator 11, a possible configuration for which is shown in greater detail in FIG. 2, which receives inputs from a reference signal source, $f_r$, and from another means such as a switch or a register, which specifies the integer phase increment, N. This phase accumulator is typically an accumulating adder or counter or other means for generating a numeric sequence representing phase presettable to an arbitrary number N which generates addresses which are then applied to a wave table 12, such as a waveform memory or look up table, to obtain amplitude values for the waveform at instantaneous phase locations. Alternatively, other arrangements such as mapping or logic devices or any device capable of performing phase to amplitude conversion or mapping can be used The output of the memory is latched at latch 13 .in synchronism with the input reference frequency and applied to a digital-to-analog converter 14. The output of the D/A converter is then filtered to remove spurious frequency components higher than the Nyquist frequency and, thus, produce the desired waveform at the desired frequency. This arrangement is well understood in the art and further detailed disclosure is not deemed necessary. If it is desired that the DDS perform in a decimally related fashion, the phase accumulator will necessarily be organized in a decimal radix fashion, for instance, using logic circuitry which accumulates or counts and provides addresses in BCD or similar decimal code.

Using a decimal radix for waveform synthesis, while maximizing operator convenience, has numerous drawbacks from the standpoints of hardware, efficiency and accuracy These drawbacks stem largely from the fact that BCD is only approximately 60% as efficient in terms of storage, latches, etc as pure binary; requiring four bits to access ten addresses rather than sixteen as in binary. Further, phase accumulation at high phase resolutions requires carry operations which, while well understood and not particularly complex, do require more logic operations which require some finite time interval. This represents a significant limitation in high frequency synthesis As a design minimum, accommodation of such operations requires a complex clock arrangement and tends to introduce timing inaccuracies in the phase accumulator or elsewhere in the system, such as at the waveform memory or the digital to analog converter. Such timing errors tend, in turn, to introduce errors into the output waveform in the form of distortion and spurious signals, resulting in degradation of waveform fidelity. The above method is also inefficient in utilization of waveform memory as compared to an all binary system. Memory access is also impaired since the waveform memory addresses may not be sequentially scanned because of the codes which would be missing from nondecimal locations.

Other known types of digital waveform generators have avoided these problems by employing binary design throughout at significant cost to operator convenience and at some cost in the difficulty of design. Specifically, if it is desired to accurately generate a decimally specified frequency, the reference frequency must be a integral power of 2, which is difficult to specify decimally during initial reference oscillator design and difficult to maintain without complex monitoring arrangements Also, since the electronic equipment with which the digital waveform synthesizer is used is likely to have a decimally related clock, coherence is similarly difficult to establish and maintain Finally, the accuracy and resolution of the frequency of the synthesized waveform are difficult to specify in decimal notation and the effect of errors in such frequency or frequency resolution are difficult to predict; further exacerbating the difficulty to an operator in the use of non-decimal systems.

Numerous approaches have been used to obtain coherence of an oscillator with a reference source. Among these, phase lOcked loops are regarded as most desirable since they are well-understood and require only a relatively small number of simple components and, hence, are well suited to integration and inclusion with other circuits on an integrated circuit chip.

Another difficulty has been encountered with systems using phase locked loops to maintain frequency coherence in waveform synthesis systems in that when it was desired to change the frequency of the synthesized waveform, it was common to do so by changing the division factor in the phase-locked loop. This results in loss of phase coherence for some finite acquisition time while a lock condition of the phase-locked loop is reestablished Because of this finite acquisition time, signal generators which maintained phase coherence with phase-locked loops were unsuitable for producing signals necessary for some applications such as frequency shift keying, where rapid frequency switching is required, without resorting to complex arrangements such as plural phase-locked loops or waveform memory manipulations.

In summary, therefore, the prior art has failed to provide a direct digital synthesizer (DDS) capable of high accuracy, resolution and fidelity which is also capable of producing decimally related and specified frequencies with a decimally specified resolution and coherence to a decimal based frequency reference source with no acquisition time when synthesized frequency is changed and ease of operator use.

DISCLOSURE OF THE INVENTION

It is therefore an object of this invention to provide an interface between a decimal or other nonbinary radix related reference frequency source and a direct digital synthesizer having a binary radix phase accumulator.

It is a further object of the invention to provide a frequency converter which maintains coherence between any frequency source and the output of a DDS having a binary radix phase accumulator.

It is another object of the invention to provide a method of maintaining coherence between the output of a DDS and a reference frequency source while utilizing binary phase accumulation within the DDS, regardless of the manner in which the reference frequency is generated.

It is yet another object of the invention to provide a frequency converter using binary hardware which provides decimally based resolution.

It is a yet further object of the invention to provide a direct digital waveform synthesizer which maintains coherence with a reference signal while output frequency is changed.

It is an additional object of the invention to provide a method of deriving a variable frequency signal consistent with the use of a phase-locked loop to maintain coherence with a reference frequency.

It is a further additional object of the invention to achieve the above and other objects of the invention while maintaining the other known advantages inherent in direct digital waveform synthesis.

Thus, in accordance with one aspect of the invention, apparatus is provided comprising a frequency converter for producing a binary frequency from a reference source having a non-binary radix. The frequency converter includes a phase locked loop including a voltage controlled oscillator and a feedback path comprising a binary radix phase accumulator receiving the voltage controlled oscillator output for dividing its frequency by an arbitrary number and a phase detector which generates a voltage dependent on the relative phase of the output of the binary phase accumulator and the output from the reference source. The voltage controlled oscillator is thus made to oscillate at a frequency coherent with the output of the reference source and compatible with a binary based accumulator or other arrangement.

In accordance with a further aspect of this invention, a coherent digital frequency synthesizer is provided having a non-binary radix reference frequency source and a binary radix phase accumulator and having a frequency converter for producing a coherent binary related frequency from said reference source. The frequency converter includes a phase locked loop including a voltage controlled oscillator and a feedback path comprising a further binary radix phase accumulator receiving the output of the voltage controlled oscillator and dividing its output frequency by an arbitrary, binary radix number and a phase detector which generates a voltage dependent on the relative phase of the output of the binary phase accumulator and the output from the reference source.

In yet another aspect of this invention, a method is provided for interfacing between a non-binary reference frequency source and a waveform synthesizer circuit having a binary radix phase accumulator, including controlling the frequency of an oscillator intermediate the reference frequency source and the waveform synthesizer circuit with a control voltage derived from a comparison of the phase of the reference frequency with the output of the VCO divided by a binary radix number In accordance with an additional aspect of the invention, the provision of an additional phase accumulator in a phase-locked loop which is similar to the phase accumulator used for accessing the phase to amplitude conversion means of the direct digital waveform synthesizer permits both the agility of direct digital waveform synthesis and coherence with a reference frequency to be maintained during alteration of output frequency since the division factor or count increment of the additional phase accumulator need not be changed to alter output frequency.

The instant invention thus overcomes the abovenoted difficulties of the prior art by providing a particular type of frequency converter, capable of accepting a decimally-related reference frequency, generated at high accuracy in a manner well known and conventional in the art and generating, in a manner entirely transparent to the operator, a frequency which is coherent with the decimally-related reference frequency and permits the use of a binary radix phase accumulator in the DDS.

The above and other objects and features of the invention will become evident to those skilled in the art from the following detailed description of the invention, with reference to the attached drawings.

BEST MODE FOR PRACTICING THE INVENTION

Figure 2:
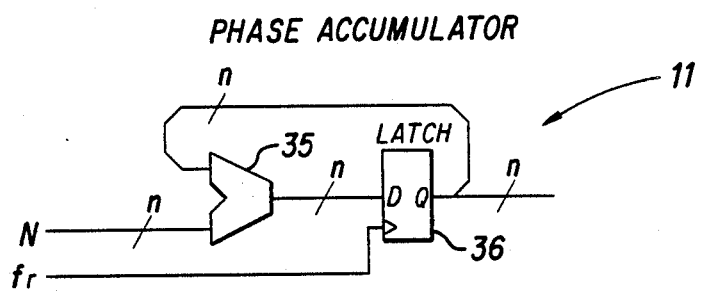
FIG. 2 is a block diagram of a phase accumulator usable in the invention.

FIG. 2 shows a block diagram of a circuit usable as a phase accumulator in the direct digital waveform synthesizer and the frequency converter according to the invention. This phase accumulator includes an adder 35 and latch 36. In operation, a digital number N is applied to one input of the adder 35 and the contents of the latch will be applied to the other. Addition of the two inputs is performed and the result is latched in parallel by latch 36, gated by a clock signal, in this case, reference frequency, $f_r$. Therafter, N is again added to the previous sum latched in latch 36 and the process is repeated.

Figure 3:
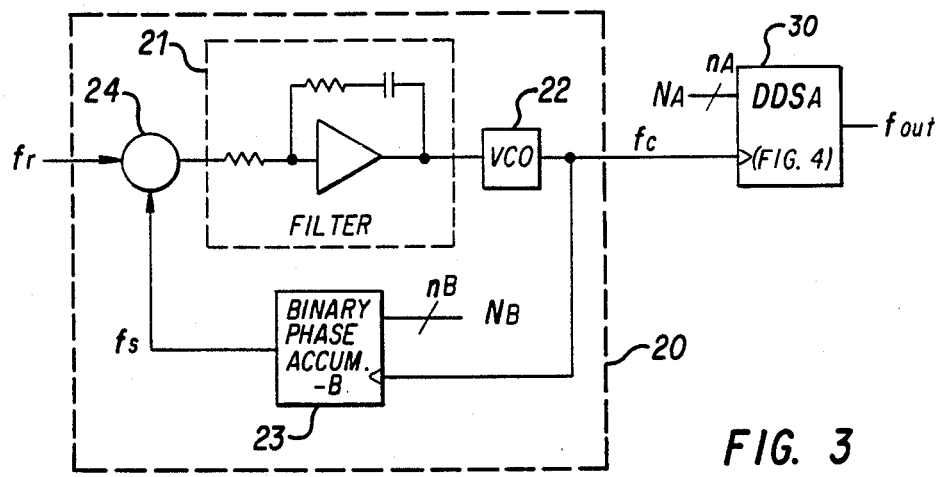
FIG. 3 is an overall block diagram of the invention.
Figure 4:
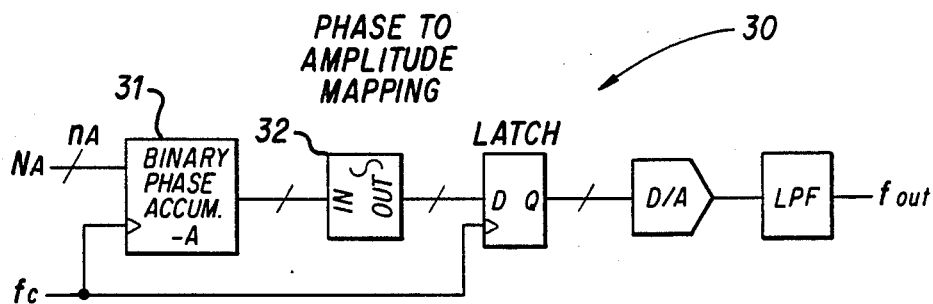
FIG. 4 is a bock diagram showing the DDS included in FIG. 3.

Connections of input N and connections of the latch and adder are made in parallel over an arbitrary number, n, of lines The output may be taken over any desired portion of the width of the parallel connection, as it is in the direct digital waveform synthesizer portion shown in FIG. 4. Clearly, the output can be taken over the full width of the parallel connection, as well If the output is taken over less than the full width, as in the preferred embodiment, the most significant bits of the phase accumulator output are used Similarly, for purposes of the phase-locked loop, only the most significant bit or overflow is preferably used as an input to the phase detector 24 of FIG. 3, whereby the phase accumulator functions in the manner of a programmable divider.

While in the phase accumulators used in this invention, n will preferably have a value of 28, assume, for purposes of illustration of the operation of the phase accumulator that n=3. If N is set to equal 1, the output numerical sequence will be 0, 1, 2, 3, 4, 5, 6, 7, 0, 1, etc. For N=2, the sequence will be 0, 2, 4, 6, 0, 2, etc. Similarly, for N=3, the sequence will be 0, 3, 6, 1, 4, 7, 2, 5, 0, 3, etc.

Figure 1:
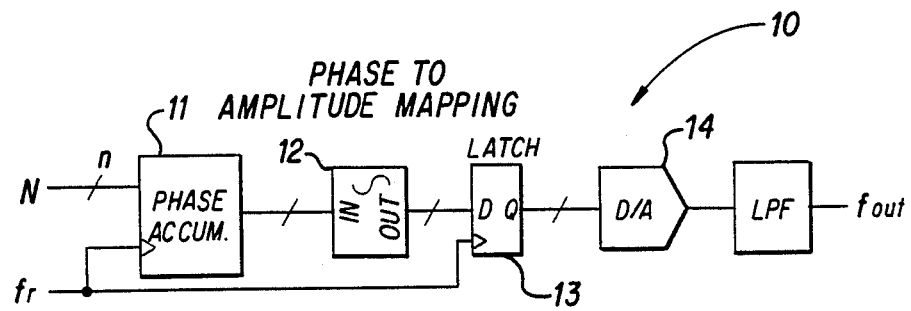
FIG. 1 is a block diagram of a conventional DDS applicable to either binary or decimal radix waveform generation.

FIG. 3 shows a novel aspect of the present invention Preceding the binary DDS 30, shown in FIG. 4 and which is similar in constitution to that of DDS 10 of FIG. 1, is placed a digital phase locked loop 20, principally characterized by the fact that the feedback path contains a further phase accumulator B, identified by reference numeral 23. This further phase accumulator 23 is arranged to count repeatedly, by preset increments, $N_B$, to an arbitrary number in a binary radix and serves to divide the output of the voltage controlled oscillator, VCO, by that integral, preprogrammed number, specified as $N_B$. The output of this further phase accumulator B 23 is provided to a phase detector 24 which outputs a voltage based on the phase difference between the reference frequency, $f_r$, and the output of the binary phase accumulator B 23. Phase detector 24 typically operates on either the leading or trailing edges of the two incoming signals $f_r$ and $f_s$. However, other arrangements, well recognized in the art, are equally suitable for phase comparison The voltage generated by the phase detector is low-pass filtered at filter 21, to remove noise and provide stability, and then used to control the operating frequency of the voltage controlled oscillator (VCO), 22. As is well understood in the art, this arrangement will provide a stable, coherent source of a waveform at a frequency proportional to $N_B$ times the reference frequency. Under lock conditions of the phase locked loop, the output of the VCO, $f_c$, which is divided by the phase accumulator B 23 will equal the reference frequency, $f_r$. Therefore, the signal output to the DDS 30 of FIG. 4 will be at a frequency which will permit synthesis of a waveform by the DDS which is coherent with $f_r$, regardless of the manner in which $f_r$ is obtained. Thus, the inclusion of the particular phase locked loop of FIG. 3 permits interfacing of the convenient decimal-based frequency generation with the hardwareefficient, high resolution, highfidelity features of a binary DDS.

For reference in the figures, the following nomenclature is used:
$f_r$=reference frequency,
$f_c$=controlled frequency output of the VCO, and
$f_2$=synchronization frequency for the phase comparator.

To demonstrate that this interfacing of otherwise incompatible arrangements is, in fact, accomplished, the following rigorous mathematical analysis is given, where
$f_{out}$ =output frequency of the DDS
n=the integer resolution of the DDS phase accumulator (in bits)
N=the integer phase increment ($0 \leq N < 2^n$), and
$f_{clock}$ =the reference clock input to the phase accumulator.

The binary DDS output frequency is given by $$f_{out} = f_{clock}(N/2^n) \tag{1}$$

The frequency resolution of the DDS is given by the derivative $$df = \frac{df_{out}}{dN} = \frac{d(f_{clock}(N/2^n))}{dN} \tag{2}$$

Therefore, $df = f_{clock}/2^n$ (Hz/count).
The phase resolution of the binary DDS is given by $$dN = 1/df. \tag{3}$$

With reference to FIG. 4, the frequency of the output of $DDS_A$ 30 is given by $$f_{out} = f_c(N_A/2^{n_A}). \tag{4}$$

Similarly, the output of the phase accumulator in the phase locked loop is given by $$f_s = f_c(N_B/2^{n_B}) \tag{5}$$

and under a lock state condition of the phase locked loop, $$f_s = f_r \tag{6}$$

by substitution in equation (5), $$f_r = f_c(N_B/2^{n_B}) \text{ or } f_c = f_r(2^{n_B}/N_B) \tag{7}$$

Substituting equation (7) into equation (4), $$f_{out} = f_r(2^{n_B}/N_B)(N_A/2^{n_A}) \tag{8}$$

Assuming for simplicity that $n_A = n_B = n$, that is, that both phase accumulators are of the same resolution (n), $$f_{out} = f_r(N_A/N_B) \tag{9}$$

Equation (8) establishes coherence since the output frequency, $f_{out}$ is a dependent variable of the reference frequency, $f_r$. Equation (9) is also valid for all values of $N_A$ and $N_B$ so that one can be fixed and the other can be programmable.

It should also be noted from equation (9) that it is the ratio of $N_A$ to $N_B$ which determines the ratio of $f_{out}$ to $f_r$. It should also be noted that equation (8) is true and establishes coherence in the more general case where the two phase accumulators are of differing resolution (e.g., where they are configured to contain a differing number, n, of bits). While it was assumed for purposes of the above analysis that both phase accumulators were configured to have the same resolution, n, in bits, in practice it is not necessary that this be so. If the resolutions differ, the above analysis equation (8) will differ from equation (9) given above only by containing a constant which is the ratio of the two terms, $2^{nA}$ and $2^{nB}$.

In a similar fashion, it may be demonstrated that $f_{out}$ can be generated or varied in decimal increments Substituting equation (7) into equation (2), $$df_A = f_c/2^{nA} = f_r(2^{nB}/N_B)(1/2^{nA}), \text{ or}$$

$$df = f_r \times \frac{2^{(nB-nA)}}{N_B} \qquad (10)$$

This means, since $f_r$ is a decimal number, that for decimal frequency resolution, df would have to be a decimal number, which could be selected by having the above ratio a decimal number, which, in turn, establishes the decimal frequency resolution of the invention.

For example, consider a coherent DDS with 1 Hz to 100 KHz frequency range, 0.01 Hz resolution and 100 KHz reference frequency and that both accumulators have a resolution of n=28 bits. The fixed phase value, $N_B$, which will make $f_s$ equal to the reference frequency, $f_r$, can be computed from substitution of these values into equation (10), and $$N_B = f_r/df = 100KHz/0.01 \ Hz = 10^7.$$

Using equation (9), a table of values for $N_A$ can be constructed from the relationship $$f_{out} = f_r(N_A/N_B) = 100KHz(N_A/10^7) = 0.01 \ N_A.$$

It is notable that it has not been necessary to calculate the frequency of VCO, and, indeed, it is only necessary to do so as an incident of the design of the VCO, itself, since its operation is entirely transparent to the operator. To determine the design frequency of the VCO in accordance with the above example, and using equation (7), $$f_c = f_r(2^n/N_B) = 100KHz(2^{28}/10^7) = 2.6843 \ldots \ MHz.$$

All of the foregoing mathematical analysis has been verified experimentally and found to function as projected by that analysis.

The unusual, non-decimally related frequency, calculated above to be provided by the VCO 22 is automatically and stably maintained by the phase locked loop portion of the present invention without operator intervention. This frequency may be applied to the DDS of FIG. 4 in precisely the same manner as $f_r$ was applied to the prior art DDS of FIG. 1, enabling a more convenient, decimally-related reference frequency to be used with the more efficient and higher performance binary digital circuitry 31, 32 of FIG. 4.

From the foregoing, it can be seen that the addition of a phase locked loop, itself well understood in the art, but configured to include a binary radix phase accumulator in the feedback path, enables the realization of the best features of both binary and decimal based DDS arrangements. The invention disclosed above provides numerous advantages over the prior art and is simple, inexpensive and suitable for fabrication as an integrated circuit. The small number of circuit elements required also facilitates the inclusion of a plurality of similar circuits in a single instrument, as is typical of use in a direct digital waveform synthesizer, or on a single chip.

Moreover, it will be understood by those skilled in the art that the same technique and apparatus has wide applicability beyond the environment of direct digital waveform synthesis, such as for transposition in electronic musical instruments or other counting or accumulating operational environments, particularly involving the scanning of a memory or other device, such as an image analyzer, where radix conversion at high speed, resolution and fidelity are necessary. It will also be understood that since the preferred environment is in a test instrument for producing complex waveforms with high accuracy which is typically used as a substitute source of waveforms in other apparatus, the invention is also applicable to all such other apparatus as an original source of such signals such as navigation, broadcast communication, vibrational wave systems, telecommunication and the like.

Having thus fully described the invention, it is clear that many variations upon the same will be evident to those skilled in the art without departure from the spirit and scope of the invention disclosed. Therefore, it is to be kept in mind that disclosure in the context of a DDS is by way of example and not of limitation. It is intended that the scope of the disclosed invention be limited only by the appended claims.

We claim:

1. A frequency converter for producing a binary frequency from a reference frequency source having a non-binary radix, including
   a phase locked loop including a voltage controlled oscillator and a feedback path
   said path comprising
   (a) a binary radix phase accumulator receiving the output of said voltage controlled oscillator and dividing the frequency of said output of said voltage controlled oscillator by an arbitrary, binary radix number, and
   (b) a phase detector controlling said voltage controlled oscillator, said phase detector generating a voltage dependent on the relative phase of the output of said binary radix phase accumulator and the output from the reference source,
   whereby said voltage controlled oscillator is made to oscillate at a frequency different from but coherent with the output of the reference source.

2. A frequency converter as claimed in claim 1, wherein said phase locked loop further includes a low-pass filter connected between the output of said phase detector and the input of said voltage controlled oscillator.

3. A coherent digital frequency synthesizer having a non-binary radix reference frequency source and a binary radix phase accumulator receiving a binary frequency, including
   a frequency converter for producing said binary frequency from the reference source having a non-binary radix and including
   a phase locked loop including a voltage controlled oscillator and a feedback path
   said path comprising
   (a) a further binary radix phase accumulator receiving the output of said voltage controlled oscillator and dividing the frequency of said output of said voltage controlled oscillator by an arbitrary, binary radix number and
   (b) a phase detector controlling said voltage controlled oscillator, said phase detector generating a voltage dependent on the relative phase of the output of said further binary radix phase accumulator and the output from said reference source, whereby said voltage controlled oscillator provides said binary frequency to said binary radix phase accumulator.

4. A coherent digital frequency synthesizer as claimed in claim 3, wherein said phase locked loop further includes a low-pass filter connected between the output of said phase detector and the input of said voltage controlled oscillator.

5. A coherent digital frequency synthesizer as claimed in claim 3, further including
means responsive to said binary radix phase accumulator for mapping phase values to instantaneous amplitude values.

6. A coherent digital frequency synthesizer as claimed in claim 5, wherein said mapping means is a look up table memory.

7. In a direct digital synthesizer, a method for interfacing between a non-binary reference frequency source and a waveform synthesizer circuit having a binary radix phase accumulator, comprising the steps of
controlling with a control voltage the frequency of a voltage controlled oscillator intermediate said reference frequency source and said waveform synthesizer circuit, said voltage controlled oscillator providing an output to said waveform synthesizer circuit,
dividing the frequency of the output of said voltage controlled oscillator by a binary radix number,
comparing the phase of the divided frequency of the immediately preceding step with the phase of the reference frequency to develop said control voltage responsive to the relative phase thereof, and
applying said control voltage to said voltage controlled oscillator,
whereby said voltage controlled oscillator produces a frequency coherent with said reference frequency and compatible with said binary radix phase accumulator of said waveform synthesizer.

8. In an electrical waveform synthesizer having a controllable binary radix phase accumulator and a phase to amplitude conversion means responsive thereto, the improvement comprising
a frequency converter having a phase-locked loop including a further controllable binary radix phase accumulator, a phase detector responsive to the output of said further binary radix phase accumulator and to a reference frequency input, and a variable frequency oscillator responsive to said phase detector and providing an output to said controllable binary radix phase accumulator and to said further controllable binary radix phase accumulator, said frequency converter receiving said reference frequency input and producing an output having a selected frequency coherent with said reference frequency input,
whereby the frequency of an output of said electrical waveform synthesizer may be altered by control of at least one of said controllable binary radix phase accumulator and said further binary radix phase accumulator.

9. In an electrical waveform synthesizer according to claim 8, the improvement further comprising means for independently controlling said controllable binary radix phase accumulator and said further binary radix phase accumulator,
whereby said output frequency may be freely altered by control of said controllable binary radix accumulator while coherence with said reference frequency input is maintained by said further controllable binary radix phase accumulator.

10. In combination, a direct digital waveform synthesizer having a binary radix phase accumulation means and a phase-locked loop, said phase locked-loop including a further binary radix accumulation means; said phase-locked loop receiving a reference frequency signal and outputting a signal of a selected frequency to said binary radix phase accumulation means of said direct digital waveform synthesizer.

* * * * *